United States Patent
Hiratsuka et al.

(10) Patent No.: US 11,405,015 B2
(45) Date of Patent: Aug. 2, 2022

(54) SURFACE ACOUSTIC WAVE DEVICE

(71) Applicant: NDK SAW Devices Co., Ltd., Hokkaido (JP)

(72) Inventors: Yuya Hiratsuka, Saitama (JP); Kazuhiro Hirota, Saitama (JP)

(73) Assignee: NDK SAW Devices Co., Ltd., Hokkaido (JP)

( * ) Notice: Subject to any disclaimer, the term of this patent is extended or adjusted under 35 U.S.C. 154(b) by 837 days.

(21) Appl. No.: 16/278,192

(22) Filed: Feb. 18, 2019

(65) Prior Publication Data
US 2019/0260348 A1 Aug. 22, 2019

(30) Foreign Application Priority Data
Feb. 19, 2018 (JP) .............................. JP2018-027225

(51) Int. Cl.
*H03H 9/02* (2006.01)
*H03H 9/64* (2006.01)
*H03H 9/145* (2006.01)

(52) U.S. Cl.
CPC .... *H03H 9/02551* (2013.01); *H03H 9/02559* (2013.01); *H03H 9/02574* (2013.01);
(Continued)

(58) Field of Classification Search
CPC ........... H03H 9/02551; H03H 9/02559; H03H 9/02574; H03H 9/02992; H03H 9/14538; H03H 9/6483
(Continued)

(56) References Cited

U.S. PATENT DOCUMENTS

2019/0074819 A1\* 3/2019 Goto .................. H03F 3/21

FOREIGN PATENT DOCUMENTS

| JP | H06326553 | 11/1994 |
|----|-----------|---------|
| JP | H10178331 | 6/1998  |

(Continued)

OTHER PUBLICATIONS

Tsutomu Takai, et al., "L.H.P. Saw Technology and its Application to Microacoustic Components (Invited)," Ultrasonic Symp., Sep. 2017, pp. 1-8.
(Continued)

*Primary Examiner* — Hafizur Rahman
(74) *Attorney, Agent, or Firm* — JCIPRNET

(57) ABSTRACT

A surface acoustic wave device includes a quartz layer, a piezoelectric layer, and an Inter Digital Transducer. A rotation in a right-screw direction is assumed as a +-rotation. A three-dimensional coordinate system formed by an x1-axis, a y1-axis, and a z1-axis respectively matching an X-axis, a Y-axis, and a Z-axis as crystallographic axes of a quartz-crystal is rotated from +125.25° in a range of ±3° with the x1-axis as a rotation axis. Subsequently, the three-dimensional coordinate system is rotated from +45° in a range of ±2° with the z1-axis as the rotation axis. Subsequently, the three-dimensional coordinate system is rotated from -45° in a range of ±2° with the x1-axis as the rotation axis. The quartz layer is cut along a surface as a sectional plane perpendicular to the z1-axis. The quartz layer has a propagation direction of the surface acoustic wave in a direction parallel to the x1-axis.

6 Claims, 14 Drawing Sheets

(52) U.S. Cl.
CPC .... *H03H 9/02992* (2013.01); *H03H 9/14538* (2013.01); *H03H 9/6483* (2013.01)

(58) Field of Classification Search
USPC ........................................................ 310/311
See application file for complete search history.

(56) References Cited

FOREIGN PATENT DOCUMENTS

| | | |
|---|---|---|
| JP | 2006042225 | 2/2006 |
| JP | 2006135443 | 5/2006 |
| JP | 2010177819 | 8/2010 |
| JP | 2018026695 | 2/2018 |

OTHER PUBLICATIONS

Shoji Kakio, et al., "High-Coupling Leaky Surface Acoustic Waves on LiNbO3 or LiTaO3 Thin Plate Bonded to Quartz Substrate," 46th EM Symposium, Jun. 2017, pp. 1-13.

* cited by examiner

SURFACE ACOUSTIC WAVE DEVICE

CROSS-REFERENCE TO RELATED APPLICATIONS

This application is based on and claims priority under 35 U.S.C. § 119 to Japanese Patent Application No. 2018-027225, filed on Feb. 19, 2018, and the entire content of which is incorporated herein by reference.

TECHNICAL FIELD

This disclosure relates to a surface acoustic wave device that uses a surface acoustic wave (SAW).

DESCRIPTION OF THE RELATED ART

Recent development of mobile communication systems, such as a mobile phone, increases requests for a SAW filter that has a narrow band and a steep attenuation characteristic. Therefore, there has been reported various methods for improving obtaining satisfactory values of an electromechanical coupling coefficient $k^2$ and Temperature Coefficients of Frequency (TCF) as an indicator of a frequency versus temperature characteristic. As the improving method, there has been reported that the SAW filter is configured using a substrate where a piezoelectric substrate having a thickness about a wavelength and a high-acoustic-velocity substrate are laminated. Such a method using the laminated substrate has been known also as a method for improving characteristics of, not only the SAW filter, but other surface acoustic wave devices such as a SAW resonator.

"I. H. P. SAW Technology and its Application to Microacoustic Components (Invited)" (Tsutomu Takai et al., Ultrasonic Symp., 2017) discloses a SAW resonator that uses a substrate where a 42° Y-X $LiTaO_3$ substrate, an amorphous $SiO_2$ film, an AlN substrate, and a Si layer are laminated in this order from the top. The document discloses that such a configuration provides a temperature compensation effect by amorphous $SiO_2$, a confinement of a vibration energy by AlN as a high-acoustic-velocity substrate, and a heat radiation by Si, thus improving respective characteristics of a Q factor, the $k^2$, and the TCF compared with a case where the SAW resonator is configured with the 42° Y-X $LiTaO_3$ substrate alone. However, these characteristics are required to be improved with simple structures.

High-Coupling Leaky SAWs on $LiNbO_3.LiTaO_3$ Thin Plate Bonded to Quartz Substrate (46th EM Symposium, EM46-2-01) reports that a Longitudinal-Leaky SAW (LLSAW) resonator is configured using a substrate (for convenience of explanation, referred to as a LT-quartz bonded substrate) where an X-31° Y $LiTaO_3$ substrate and an AT-45° X quartz substrate are bonded in this order from the top. The document discloses that use of this LT-quartz bonded substrate can improve the Q factor, the $k^2$, and the TCF compared with a case where the LLSAW resonator is configured with the $LiTaO_3$ substrate alone. For this LLSAW resonator with the LT-quartz bonded substrate, the Q factor is 1057, a fractional bandwidth is 3.0%, and $k^2=7.19\%$ in a resonance frequency at $\lambda=8$ µm, a $LiTaO_3$ substrate thickness/$\lambda=0.1$, and an Inter Digital Transducer (IDT) thickness/$\lambda=0.013$. The Inter Digital Transducer is formed on this above-described $LiTaO_3$ substrate and made of Al (aluminum). The $\lambda$, is a wavelength of a surface acoustic wave.

The above-described High-Coupling Leaky SAWs on $LiNbO_3.LiTaO_3$ Thin Plate Bonded to Quartz Substrate (46th EM Symposium, EM46-2-01) has reported that the Q factor is 43 and the fractional bandwidth is 2.1% in the resonance frequency when the LLSAW resonator is configured with the X-31° Y $LiTaO_3$ substrate alone. Therefore, the use of the above-described LT-quartz bonded substrate significantly increases the Q factor and the fractional bandwidth increases as well. These Q factor and fractional bandwidth are obtained as results of a calculation with a finite element method (FEM) under a condition where infinite periodic structures are assumed on both sides of the IDT of one period as a period boundary condition, and a perfect matching layer is assumed on a bottom surface of this IDT. Drawings in the document show that the TCF of a resonance point in the case of using the LT-quartz bonded substrate is around −14 ppm/° C. under a condition where the IDT is not added. However, thus reported LLSAW resonator has the Q factor of around 1000 in an 800 MHz band, and a problem arises in that a loss is too significant to use this LLSAW resonator as a practical device. In addition, a problem arises in that a small film thickness of the electrode in the above-described LLSAW resonator fails to provide a sufficient reflection characteristic of the device. Further, a problem arises in that a thin thickness of the $LiTaO_3$ substrate makes manufacture difficult.

A need thus exists for a surface acoustic wave device which is not susceptible to the drawback mentioned above.

SUMMARY

According to an aspect of this disclosure, there is provided a surface acoustic wave device that includes a quartz layer, a piezoelectric layer, and an Inter Digital Transducer. The piezoelectric layer is laminated on the quartz layer. The Inter Digital Transducer is formed on the piezoelectric layer. The Inter Digital Transducer excites a surface acoustic wave on the piezoelectric layer. A rotation in a right-screw direction of the quartz layer is assumed as a +-rotation. A three-dimensional coordinate system formed by an x1-axis, a y1-axis, and a z1-axis respectively matching an X-axis, a Y-axis, and a Z-axis as crystallographic axes of a quartz-crystal of the quartz layer is rotated from +125.25° in a range of ±3° with the x1-axis as a rotation axis. Subsequently, the three-dimensional coordinate system is rotated from +45° in a range of ±2° with the z1-axis as the rotation axis. Subsequently, the three-dimensional coordinate system is rotated from −45° in a range of ±2° with the x1-axis as the rotation axis. The quartz layer is cut along a surface as a sectional plane perpendicular to the z1-axis. The quartz layer has a propagation direction of the surface acoustic wave in a direction parallel to the x1-axis.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

Figure 1:
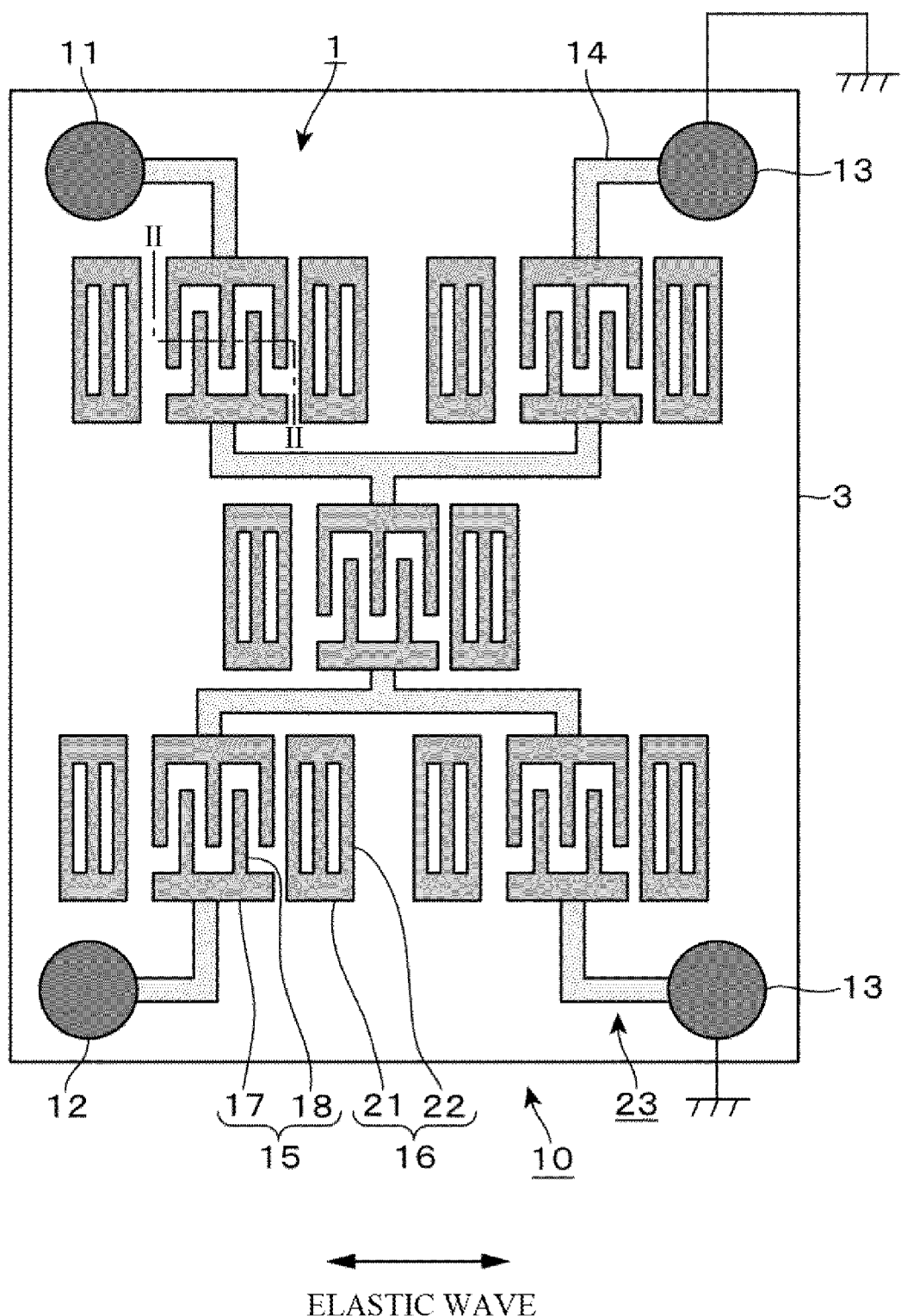
FIG. 1 is a plan view of a ladder-type filter as an exemplary SAW device of the disclosure.

FIG. 1 illustrates a ladder-type filter 10 where a plurality of SAW (surface acoustic wave) resonators 1 are combined in a ladder-type, as one embodiment of a surface acoustic wave device of the disclosure. In this ladder-type filter 10, three SAW resonators 1 are each disposed between an input port 11 and an output port 12 in series as a series arm, while one SAW resonator 1 is connected to those SAW resonators 1, 1 in parallel as a parallel arm. Each SAW resonator 1 is simply illustrated. A reference numeral 13 in the drawing denotes a ground port. A reference numeral 14 in the drawing denotes a routing electrode that electrically connects the SAW resonators 1, 1 one another or electrically connects the SAW resonator 1 to the ports 11, 12, and 13.

The SAW resonator 1 includes an Inter Digital Transducer (IDT) 15 and reflectors 16, 16 formed on both sides of this IDT 15 in a propagation direction of a surface acoustic wave (hereinafter referred to as "elastic wave"). The IDT 15 includes a pair of busbars 17, 17 and a plurality of electrode fingers 18. The pair of busbars 17, 17 each extend along the propagation direction of the elastic wave, and are disposed so as to separate from one another in a direction perpendicular to the propagation direction of the elastic wave. The plurality of electrode fingers 18 are formed in a comb shape so as to alternately face each other between the busbars 17, 17. The IDT 15 forms a conventional electrode such that the electrode fingers 18 extending from one busbar 17 among the pair of the busbars 17, 17 and the electrode fingers 18 extending adjacently to those electrode fingers 18 from the other busbar 17 are alternately disposed along the propagation direction of the elastic wave. A reference numeral 21 in the drawing denotes a reflector busbar, and a reference numeral 22 denotes a reflector electrode finger. In some cases, the IDT 15, the reflector 16, the routing electrode 14, the respective ports 11, 12, and 13, the reflector busbar 21, and the reflector electrode finger 22 are referred to as an electrode film 23. The electrode film 23 is formed of, for example, Al (aluminum), and formed on a substrate 3.

Figure 2:
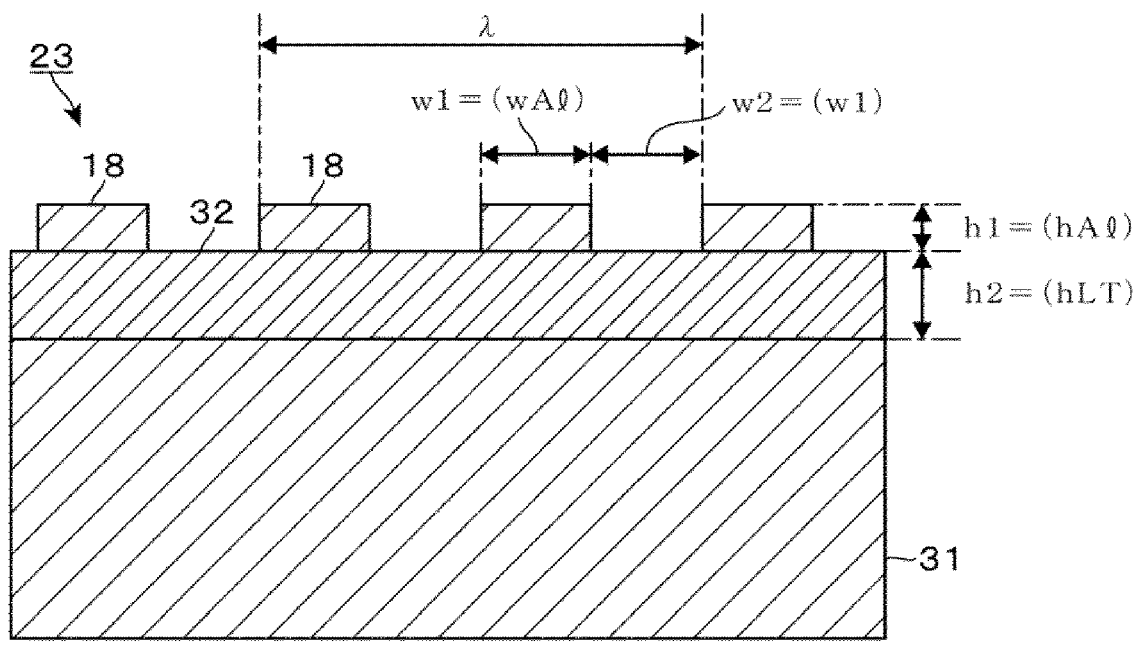
FIG. 2 is a longitudinal sectional side view of the ladder-type filter.

FIG. 2 is a cross-sectional view taken along the line II-II of FIG. 1, and illustrates a longitudinal sectional side view of the electrode finger 18 of the IDT 15 and the substrate 3. As illustrated in FIG. 2, a period length includes respective width dimensions of the mutually adjacent two electrode fingers 18, 18 and separation dimensions between these electrode fingers 18, 18, and the period length corresponds to a frequency of the elastic wave that propagates on the substrate 3. Specifically, the period length has a dimension identical to that of a wavelength 2 of the elastic wave in a desired frequency. In this example, a period length 2 is configured such that a frequency f of the LLSAW propagating on a surface of the substrate 3 becomes 2 GHz or more.

Specifically, for example, when the frequency f is 2 GHz, the period length 2 is set to 3 am in the case where the above-described surface acoustic wave has a velocity Vs of 6000 m/second.

The substrate 3 includes a quartz layer (quartz substrate) 31 and a piezoelectric layer (piezoelectric substrate) 32 of $LiTaO_3$ (hereinafter described as LT in some cases) laminated in this order from the lower side. The above-described electrode film 23 is laminated on the piezoelectric layer 32. Thus mutually bonded quartz layer 31 and piezoelectric layer 32 reduces degradation of characteristics of the device such as the Q factor due to leakage of energy on a surface of the substrate 3 as a bulk wave. Then, configuring these quartz layer 31 and piezoelectric layer 32 so as to each have a cut surface and a propagation direction of a SAW as described below ensures especially excellent characteristics of the device.

Figure 3A:
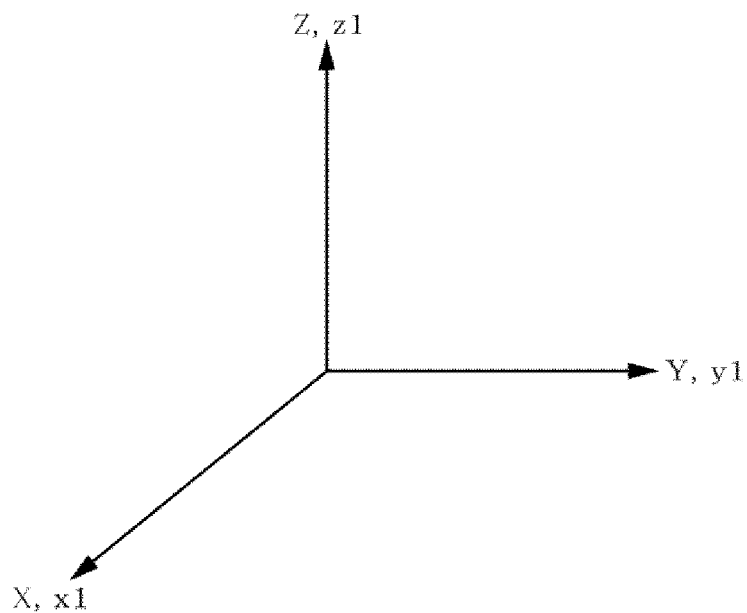
FIG. 3A and FIG. 3B are explanatory drawings illustrating cut surfaces and propagation directions of a wave in a quartz layer constituting the device.

First, the cut surface of the quartz layer 31 and the propagation direction of the wave will be described with reference to FIG. 3A to FIG. 4B. In FIG. 3A to FIG. 4B, dash-dotted arrows indicate mutually orthogonal crystallographic axes (X-axis, Y-axis, and Z-axis) of a quartz-crystal, and solid arrows indicate mutually orthogonal an x1-axis, a y1-axis, and a z1-axis. The respective axes of x1, y1, and z1 are coordinate axes of a three-dimensional coordinate system configured for identifying directions. FIG. 3A illustrates only solid arrows because the X-axis, the Y-axis, and the Z-axis match the x1-axis, the y1-axis, and the z1-axis, respectively. A coordinate system indicated by the X-axis, the Y-axis, and the Z-axis is defined as a crystal coordinate system, and a coordinate system indicated by the x1-axis, the y1-axis, and the z1-axis is defined as an azimuthal coordinate system.

Figure 3B:
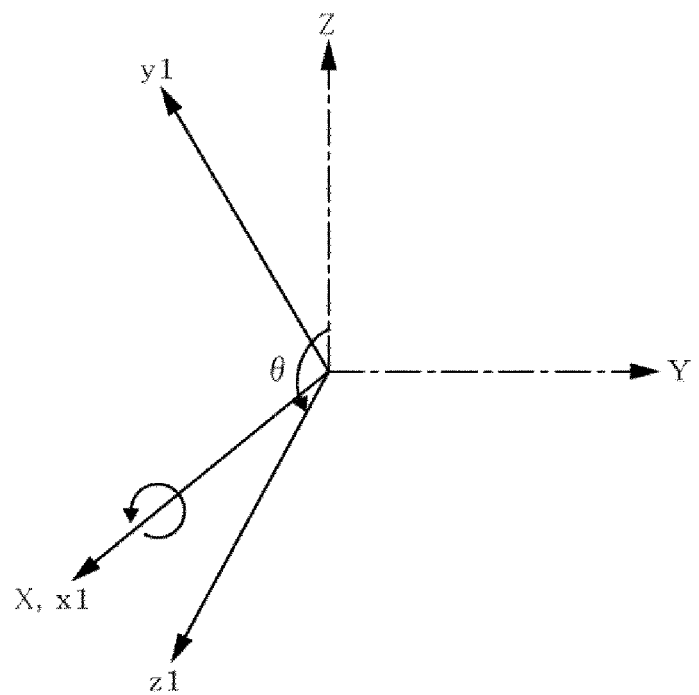

From a state illustrated in FIG. 3A, first, the azimuthal coordinate system is rotated with respect to the crystal coordinate system around the x1-axis (at this time point, matching the X-axis) as a rotation axis (see FIG. 3B). When an angle of this rotation is defined as θ, θ=125.25° is assumed here. This angle θ is an angle that indicates the rotation in a right-screw direction as a + value having θ=0° when the rotation around the x1-axis=X-axis is not made. Subsequently, the azimuthal coordinate system is rotated with respect to the crystal coordinate system around the z1-axis as a rotation axis (see FIG. 4A). When an angle of this rotation is defined as ψ, ψ=45° is assumed here. This y is an angle that indicates the rotation in the right-screw direction as a + value having ψ=0° when the rotation around the z1-axis is not made. A dotted arrow in FIG. 4A indicates the y1-axis before rotated by the angle ψ.

Figure 4A:
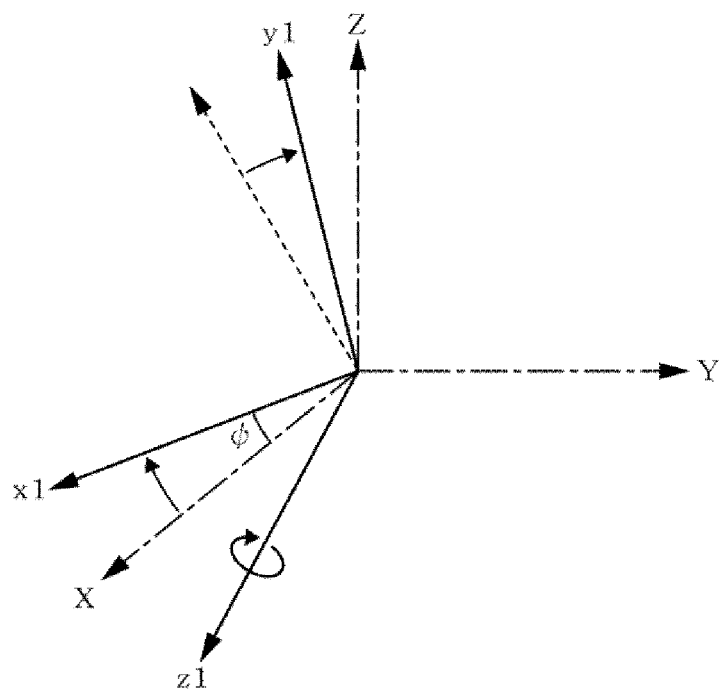
FIG. 4A and FIG. 4B are explanatory drawings illustrating the cut surfaces and the propagation directions of the wave in the quartz layer constituting the device.
Figure 4B:
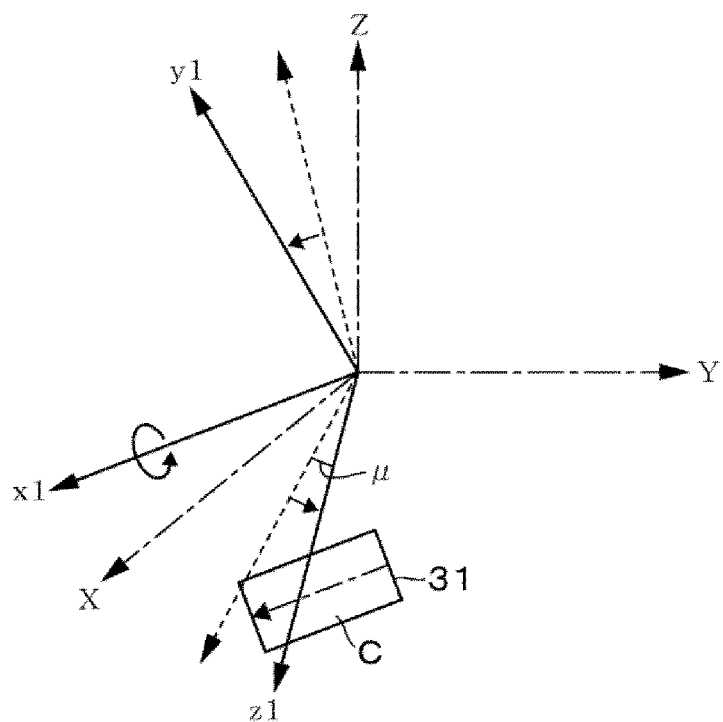

After that, the azimuthal coordinate system is rotated with respect to the crystal coordinate system around the x1-axis as a rotation axis (see FIG. 4B). When an angle of this rotation is defined as L, μ=−45° is assumed here. This L is an angle that indicates the rotation in the right-screw direction as a + value having μ=0° when this rotation around the x1-axis is not made. That is, μ=−45° means the rotation of the azimuthal coordinate system by 45° in a left-screw direction. Dotted arrows in FIG. 4B indicate the y1-axis and the z1-axis before the rotation by the angle L. The above-described quartz layer 31 is a quartz substrate cut out from the quartz-crystal having a surface perpendicular to the z1-axis of thus rotated azimuthal coordinate system as the cut surface and the x1-axis direction as the propagation direction of the SAW. In FIG. 4B, a principal surface of the quartz layer 31 as the above-described cut surface is indicated as C, and the propagation direction of the SAW is indicated by a two-dot chain arrow.

The cut surface C and the SAW propagation direction of the quartz layer 31 will be further supplementarily described. A quartz substrate indicated as (0, 0, T) in a notation with Euler angle is a quartz substrate cut out from a quartz-crystal having the x1-axis direction as the SAW propagation direction and a surface perpendicular to the z1-axis as a cut surface when the azimuthal coordinate system is rotated with respect to the crystal coordinate system around the z1-axis by φ (unit: °), around the x1-axis by φ (unit: °), and around the z1-axis by ψ (unit: °) in this order from the state e where the respective axes of the crystal coordinate system match the axes of the azimuthal coordinate system as illustrated in FIG. 3A. Note that, φ means the rotation in the right-screw direction when 0 has a + value similarly to θ and ψ. The above-described quartz layer 31 is a quartz substrate having the cut surface and the SAW propagation direction determined based on the azimuthal coordinate system determined by further rotating the azimuthal coordinate system, which is determined with φ=0°, θ=125.25°, and ψ=45° in the notation with the Euler angle, by μ=−45°.

Figure 5:
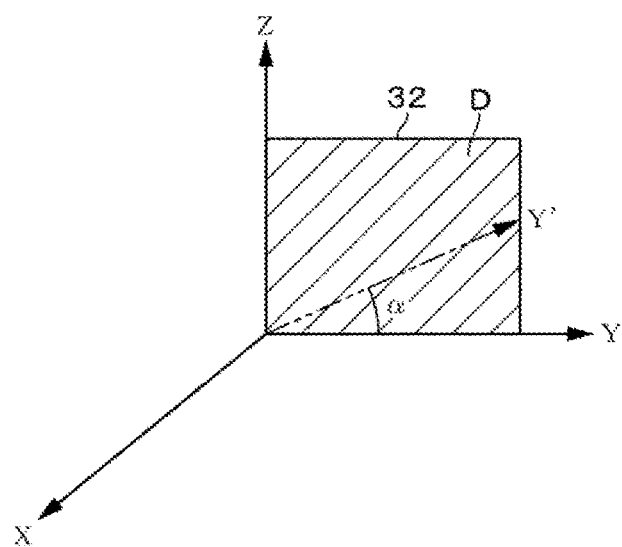
FIG. 5 is an explanatory drawing illustrating cut surfaces and propagation directions of a wave in a piezoelectric layer constituting the device.

Returning to FIG. 2, the description will be continued. The piezoelectric layer 32 is made of LiTaO₃ (lithium tantalite, hereinafter referred to as LT), and more specifically, made of X-31° Y LT. The following describes this X-31° Y LT also with reference to FIG. 5. The respective axes of X, Y, and Z in FIG. 5 indicate crystallographic axes of LT. It is assumed that an axis rotated from the Y-axis around the X-axis as the rotation axis by α ° is a Y'-axis and this Y'-axis runs in the SAW propagation direction. Note that, a having a + value means the rotation in the right-screw direction, and α=0° is assumed when the Y'-axis matches the Y-axis. The notation before a hyphen in X-31° Y indicates the direction of the cut, thus indicating that an X-cut has been performed in this case. That is, a hatched plane perpendicular to the X-axis in FIG. 5 is the cut surface of the piezoelectric layer 32 and a reference sign D is assigned. The notation after the hyphen indicates the above-described α °. The piezoelectric layer 32 notated with the above-described Euler angle (φ, θ, and ψ) has φ=90°, θ=90°, and ψ=31°.

Figure 6:
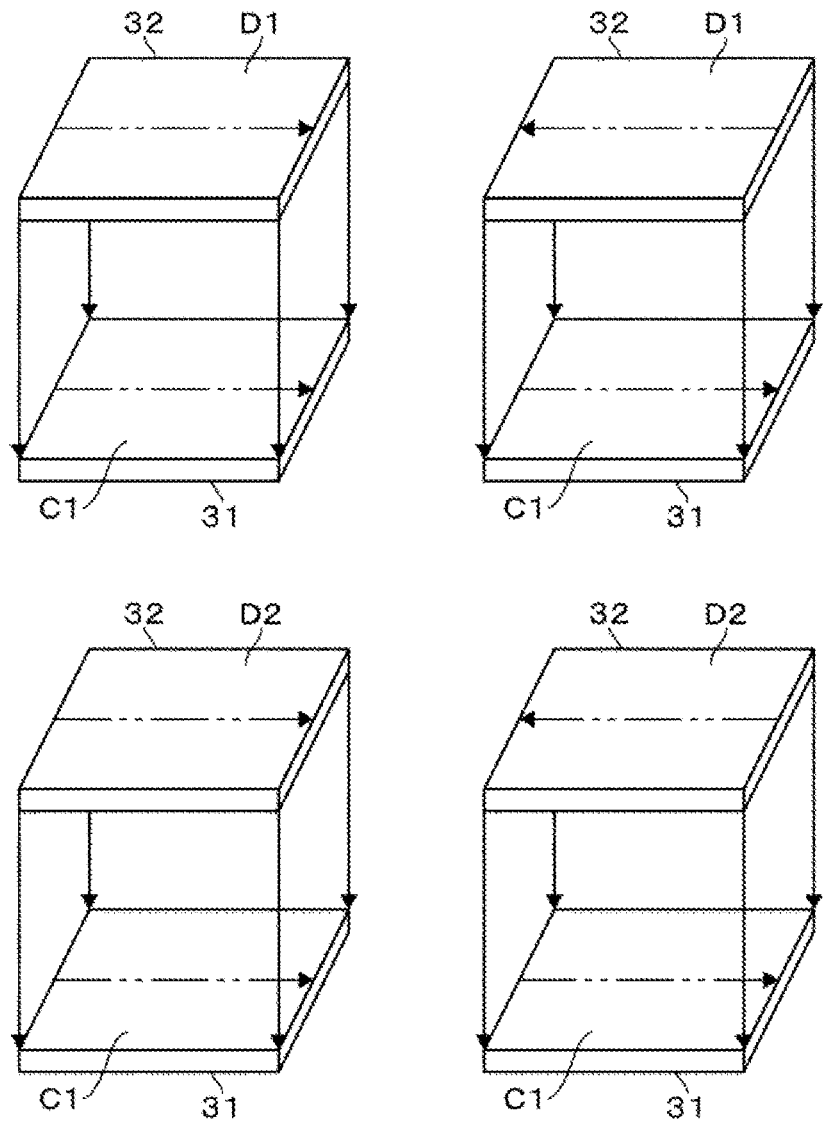
FIG. 6 includes perspective views illustrating directions of the quartz layer and the piezoelectric layer constituting the device.

A description will be given of a bonding direction of the above-described quartz layer 31 and the piezoelectric layer 32 with reference to FIG. 6. For convenience of explanation, one of two principal surfaces C of the quartz layer 31 is defined as a front surface C1 while the other is defined as a back surface, and one of two principal surfaces D of the piezoelectric layer 32 is defined as a front surface D1 while the other is defined as a back surface D2. FIG. 6 illustrates a bonding example where the front surface C1 of the quartz layer 31 is a bonding surface to the piezoelectric layer 32. Two-dot chain arrows illustrated on the quartz layer 31 and the piezoelectric layer 32 in FIG. 6 indicate the SAW propagation direction similarly to the two-dot chain arrows in FIG. 4B and FIG. 5, and base end sides of the arrows are defined as one ends while distal end sides are defined as other ends.

As illustrated in FIG. 6, the quartz layer 31 and the piezoelectric layer 32 are bonded together such that the SAW propagation directions run mutually parallel, thus forming the substrate 3. That is, both the front surface D1 and the back surface D2 of the piezoelectric layer 32 can be bonded to the front surface C1 of the quartz layer 31, and both the one end and the other end of the piezoelectric layer 32 can be bonded to the one end of the front surface C1 of the quartz layer 31. Similarly, both the front surface D1 and the back surface D2 of the piezoelectric layer 32 can be bonded to the back surface of the quartz layer 31, and both the one end and the other end of the piezoelectric layer 32 can be bonded to the one end of the back surface of the quartz layer 31. This is because the characteristics of the substrate 3 does not change or approximately not change due to the symmetries of the crystals constituting the quartz-crystal and LT when the wave propagation directions of the quartz layer 31 and the piezoelectric layer 32 run mutually parallel.

Next, returning to FIG. 2 to describe the electrode finger 18. This electrode finger 18 is assumed to have a thickness as h1 (unit: μm), and this thickness h1 is divided by the above-described wavelength λ (unit: μm) to be normalized. Thus obtained thickness is defined as a normalized thickness (h1/λ) of the electrode finger 18. The electrode finger 18 is assumed to have a width as w1 (unit: μm), and this width w1 is divided by the above-described wavelength λ (unit: μm) to be normalized. Thus obtained length is defined as a normalized width (w1/λ) of the electrode finger 18. In the drawing, a width w2 (unit: μm) between the adjacent electrode fingers 18 is equal to w1, and w1+w2=λ/2 is satisfied.

The electrode finger 18 is made of a material assumed to have a density as ρ (unit: kg/m³). The electrode finger 18 constituting the IDT 15 is required to have an appropriate wave reflection amount |κ12'| so as to fulfill its function and ensure an appropriate design of a SAW device, and specifically, the reflection amount |κ12'| is preferred to satisfy 0.025≤|κ12'|≤0.04. Note that, |κ12'| is simply expressed as κ12 in some cases below. While a description will be given later as test results, κ12 corresponds to ρ(h1/λ)(w1/λ), and preferably, the material, the normalized thickness, and the normalized width of the electrode finger 18 are each determined so as to satisfy 12 kg/m³≤ρ×(h1/λ)×(w1/λ)≤50 kg/m³ for obtaining a practically appropriate reflection amount κ12.

In this example, the electrode film 23 including the electrode finger 18 is assumed to be made of Al (aluminum), and when the electrode finger 18 is thus made of Al, the above-described h1 is expressed as hAl, and w1 is expressed as wAl. The material of the electrode film 23 is not necessarily made of Al, and can be made of a metal, such as Au (gold), Cu (copper), Mo (molybdenum), W (tungsten), Pt (platinum), Sc (scandium), and Ti (titanium), or an alloy containing the above-described metals. The electrode film 23 may be formed of a laminated body of the above-described metals.

Now, a supplementary description will be given of the above-described piezoelectric layer 32. The thickness of the piezoelectric layer 32 is indicated as h2 in FIG. 2. Then, this h2 is divided by λ to be normalized, and thus obtained thickness is defined as a normalized thickness (h2/λ) of the piezoelectric layer 32. As described later, while the piezoelectric layer 32 is not necessarily made of LT, when the piezoelectric layer 32 is made of LT, this piezoelectric layer 32 has the thickness h2 expressed as hLT.

The following describes a test performed through simulations on the SAW device illustrated in FIG. 2 where the quartz layer 31, the piezoelectric layer 32 made of LT, and the electrode finger 18 made of Al are laminated. The simulations each have a setting where a viscosity loss is not included and the SAW device has an infinite periodic structure. The test was performed such that, for a Q factor (Qr) of a resonance frequency (fr) and a Q factor (Qa) of an anti-resonance frequency (fa), a condition (defined as a first condition) where only one of the Qr and the Qa became proper and a condition (defined as a second condition) where both the Qr and the Qa became proper were each calculated. For convenience, this test is referred to as Test 1. The above-described condition where only one of the Qr and the Qa becomes proper is a condition where the Qr becomes maximum, and the condition where both the Qr and the Qa become proper is a condition where a larger value of either 1/Qr or 1/Qa becomes minimum. In this test 1, (θ, ψ, and μ) described with reference to FIG. 3A to FIG. 4B is set to θ=125.25°, ψ=45°, and μ=−45° as described above.

In the description of the test results, for convenience, the TCF of the resonance frequency fr is indicated as a TCF-fr, and the TCF of the anti-resonance frequency fa is indicated as a TCF-fa. The $k^2$ is calculated as {(π/2·fr/fa)/tan(π/2·fr/fa)}. Under the above-described first condition, at λ=8 m, hLT/λ=0.13, and hAl/λ=0.052, Vs=5951 m/second, Qr=110888, Qa=1621, $k^2$=7.72%, TCF-fr=−11.4 ppm/° C., TCF-fa=−35.6 ppm/° C., and κ12=0.0352 were obtained. Under the above-described second condition, at λ=8 m, hLT/λ=0.18, and hAl/λ=0.065, Vs=5840 m/second, Qr=3961, Qa=3896, $k^2$=7.73%, TCF-fr=−14.64 ppm/° C., TCF-fa=−40.59 ppm/° C., κ12=0.0371 were obtained.

The LLSAW resonator, described in DESCRIPTION OF THE RELATED ART, that includes the LT-quartz bonded substrate has, approximately, Qr=1057, $k^2$=7.19%, and TCF-fr=−14 ppm at hAl/λ=0.013 and hLT/λ=0.1 as described above. Accordingly, the SAW device according to the embodiment of the disclosure provides higher values of Qr and $k^2$ under the condition of larger hAl/λ and hLT/λ compared with this LLSAW resonator that includes the LT-quartz bonded substrate. It is preferred that hAl/λ and hLT/λ are large from an aspect of facilitating the control of the film thickness in the manufacture and the mass production of the device. The values of κ12 under the first condition and the second condition are included in the above-described preferred range (0.025 to 0.04). While appropriate values are configured corresponding to equipment to which the SAW device is mounted, the $k^2$ is typically preferred to be a high value because the versatility of the device is increased. As described above, it was confirmed from the result of this test 1 that the SAW device according to the embodiment of the disclosure could have hAl/λ and hLT/λ each set to a relatively large value and could provide the Qr and the $k^2$ having preferable values compared with those of the prior art.

Next, a description will be given of a test that examined variations in respective losses of the resonance frequency (fr) and the anti-resonance frequency (fa) when the angle θ, hAl/λ, and hLT/λ were each varied for the SAW device according to the embodiment of the disclosure described with reference to FIG. 2. For convenience, this test is referred to as Test 2. The above-described loss is indicated as 1/Q, thus 1/Qr and 1/Qa are measured in this Test 2. Note that, in this Test 2, the angles ψ and μ are set to 45° and −45°, respectively, as described with reference to FIG. 3A to FIG. 4B.

Figure 7:
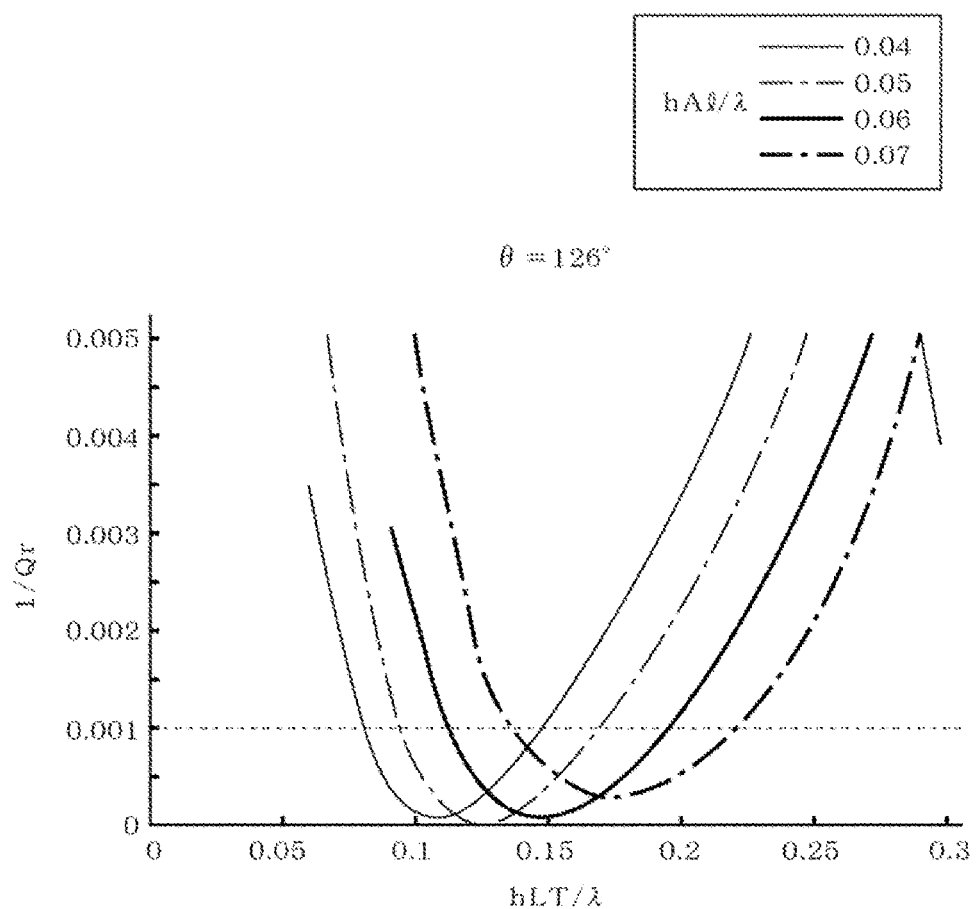
FIG. 7 is a graph indicating a relation between respective thicknesses of the piezoelectric layer and an electrode constituting the device, and 1/Q of the device.
Figure 8:
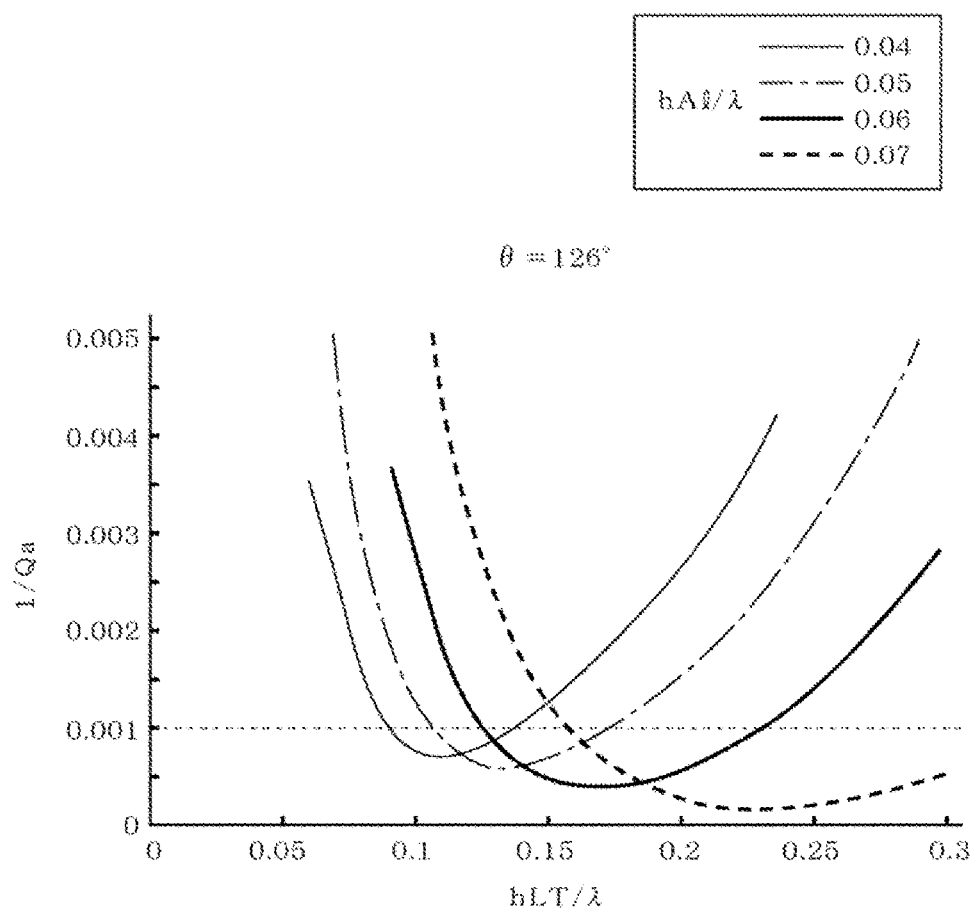
FIG. 8 is a graph indicating a relation between respective thicknesses of the piezoelectric layer and the electrode constituting the device, and 1/Q of the device.

FIG. 7 and FIG. 8 are graphs indicating the results when the angle θ is 126°. FIG. 7 indicates the result of 1/Qr, and FIG. 8 indicates the result of 1/Qa. Then, these graphs of FIG. 7 and FIG. 8 each has a horizontal axis indicating hLT/λ and a vertical axis indicating 1/Qr or 1/Qa. In each graph, the values of hAl/λ are indicated by lines of mutually different types. For the use of the SAW device in the bandwidth of 2 GHz or more, the Q factor (Qr and Qa) is preferred to be 1000 or more, thus 1/Q (=1/Qr and 1/Qa) is preferred to be 0.001 or less. The graphs of FIG. 7 and FIG. 8 show that appropriately setting the range of hLT/λ and the range of hAl/λ ensures 1/Qr and 1/Qa to be each 0.001 or less. For the angle θ, the test was performed by changing the angle θ in increments of 2° within a range of 120° to 130°, and a graph indicating a relation among hLT/λ, 1/Q, and hAl/λ is obtained for each angle θ similarly to FIG. 7 and FIG. 8. For convenience of explanation, this graph indicating the relation among hLT/λ, 1/Q, and hAl/λ for each angle is referred to as an angle-divided graph. That is, among a plurality of obtained angle-divided graphs, a graph of θ=126° is representatively indicated in FIG. 7 and FIG. 8.

Figure 9A:
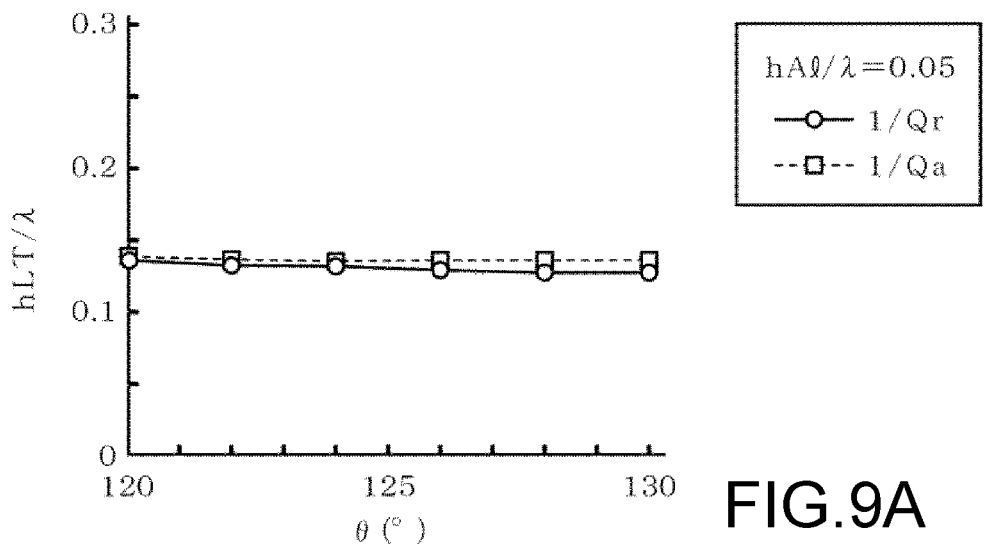
FIG. 9A to FIG. 9C are graphs indicating relations between the thickness of the piezoelectric layer and an angle of a cut of the quartz layer.

FIG. 9A to FIG. 10C are graphs indicating the results of Test 2 in an aspect different from the above-described angle-divided graph. FIG. 9A and FIG. 10A indicate the results in the case of hAl/λ=0.05 (=5%), FIG. 9B and FIG. 10B indicate the results in the case of hAl/λ=0.06 (=6%), and FIG. 9C and FIG. 10C indicate the results in the case of hAl/λ=0.07 (=7%). The graphs of FIG. 9A to FIG. 9C each have a vertical axis indicating hLT/λ, and a horizontal axis indicating the angle θ. Then, values of hLT/λ where 1/Qr and 1/Qa read from the angle-divided graphs are each minimum are plotted. The graphs of FIG. 10A to FIG. 10C each have a vertical axis indicating 1/Q, and a horizontal axis indicating the angle θ. Then, values of 1/Qr and 1/Qa corresponding to the values of hLT/λ plotted in FIG. 9A to FIG. 9C, that is, respective minimum values of 1/Qr and 1/Qa are plotted. In each graph of FIG. 9A to FIG. 10C, the plotted points of 1/Qr are connected by a solid line, and the plotted points of 1/Qa are connected by a dotted line.

Figure 9B:
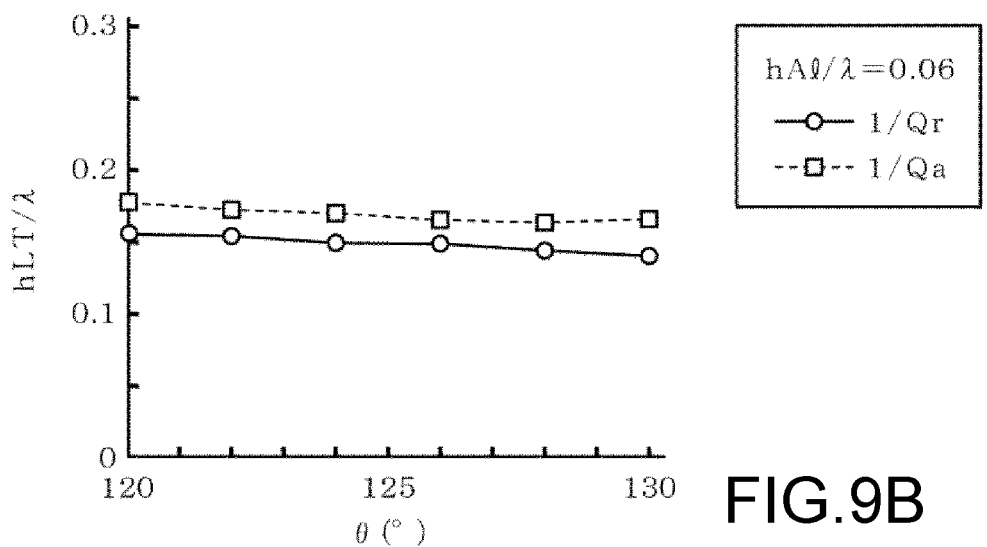
Figure 9C:
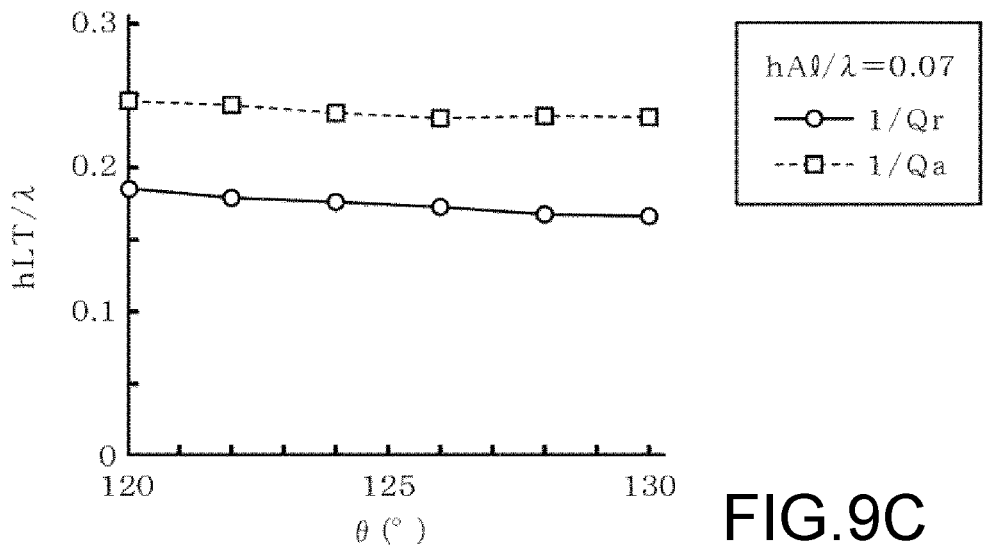
Figure 10A:
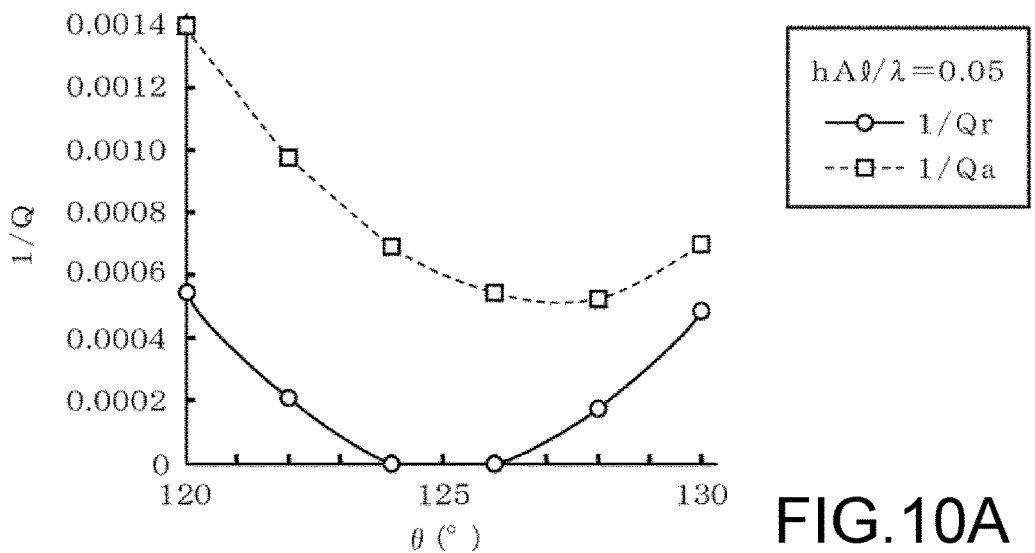
FIG. 10A to FIG. 10C are graphs indicating relations between a loss of the device and the angle of the cut of the quartz layer.
Figure 10B:
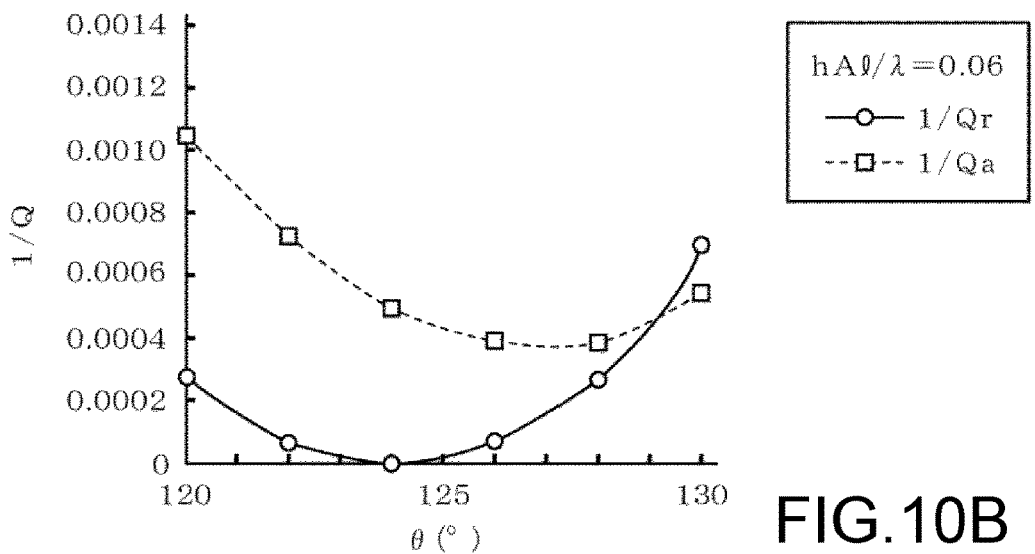
Figure 10C:
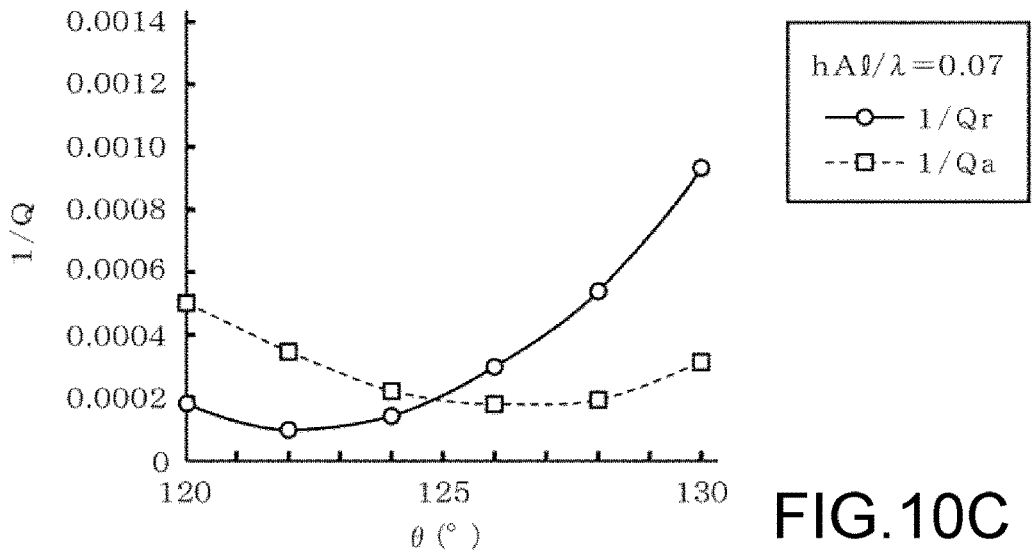

The graphs of FIG. 9A to FIG. 9C each show that hLT/λ with the minimum loss hardly varies even if the angle θ varies, thus dependence of hLT/λ on the angle θ is relatively small. It is also seen that increase in hAl/λ causes a trend that a difference increases between hLT/λ having the minimum 1/Qr and hLT/λ having the minimum 1/Qa. The graphs of FIG. 10A to FIG. 10C each show that the angle θ having the minimum 1/Qr varies depending on hAl/λ, while thus minimum 1/Qr does not significantly vary even if hAl/λ varies. Then, it is seen that 1/Qa at the angle θ of a predetermined value decreases as hAl/λ increases.

Figure 11:
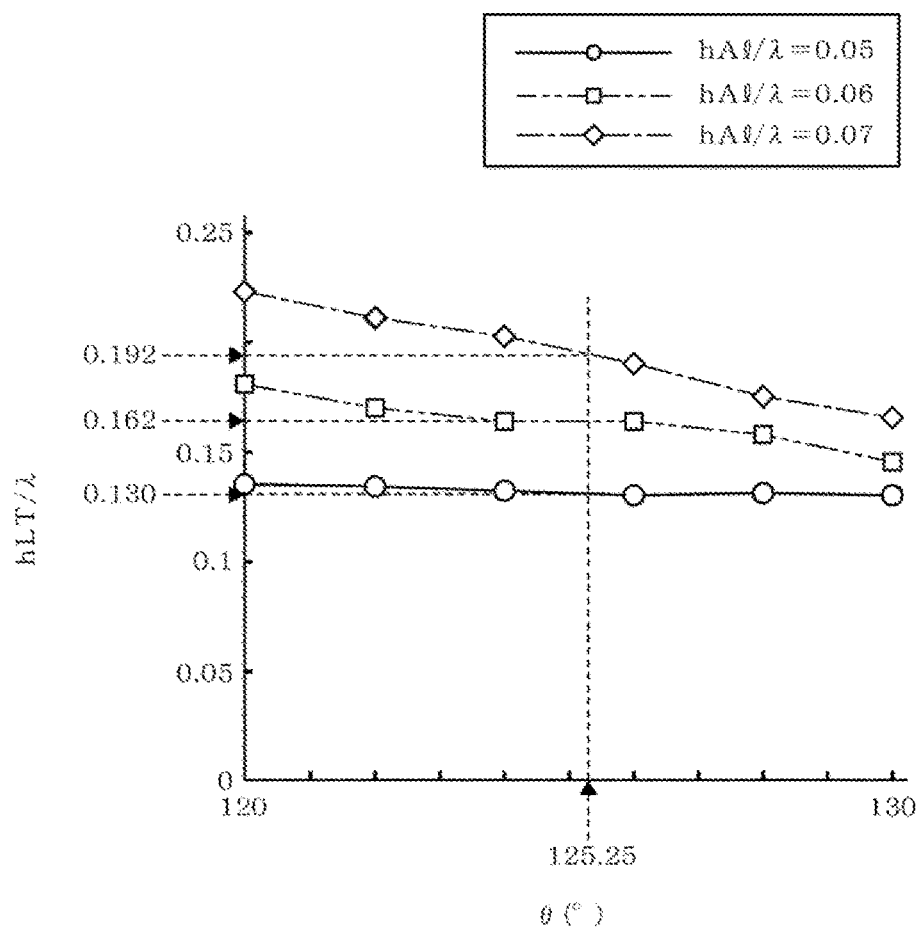
FIG. 11 is a graph indicating a relation between the thickness of the piezoelectric layer and the angle of the cut of the quartz layer.

FIG. 11 is a graph indicating the results of Test 2 in a further different aspect. In this graph of FIG. 11, values of hLT/λ where a larger value of either 1/Qr or 1/Qa becomes minimum are read from the above-described angle-divided graph and plotted. That is, the values of hLT/λ where both Qr and Qa are proper are read and plotted. In this graph of FIG. 11, a vertical axis indicates thus read hLT/λ and a horizontal axis indicates the angle θ. The above-described reading of hLT/λ is performed for each hAl/λ, and the above-described plotting is performed for each hAl/λ. Then, the plotted points are connected by lines of types corresponding to the values of hAl/λ. This graph of FIG. 11 shows that, when the angle θ has a predetermined value in a range of 120° to 130°, the value of hLT/λ where the values of both Qr and Qa are proper increases as the value hAl/λ increases. As described above, to enhance the ease in the mass production of the device and to ensure the appropriate reflection amount, it is preferred that the values of hLT/λ and hAl/λ are relatively large. Accordingly, such large values of hLT/λ and hAl/λ to obtain the high Q factor are preferable.

Figure 12A:
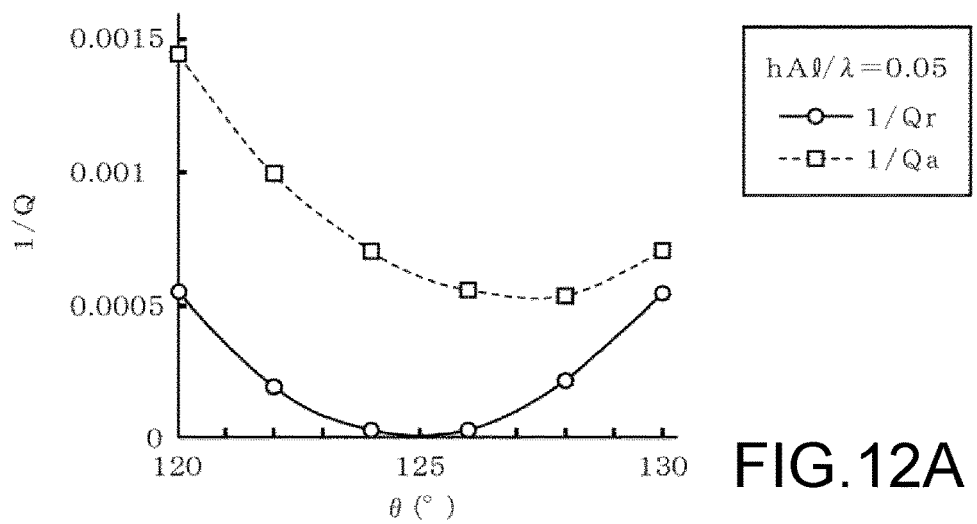
FIG. 12A to FIG. 12C are graphs indicating the relations between the loss of the device and the angle of the cut of the quartz layer.
Figure 12B:
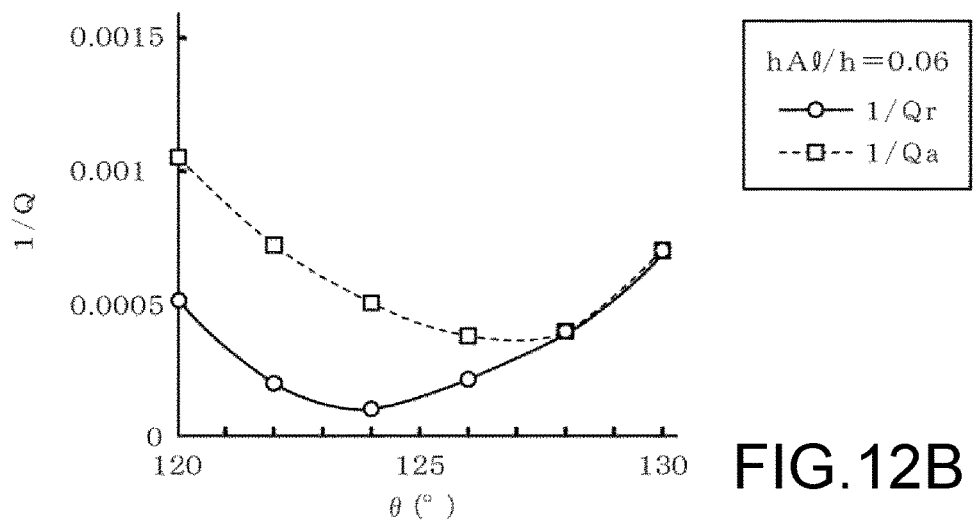
Figure 12C:
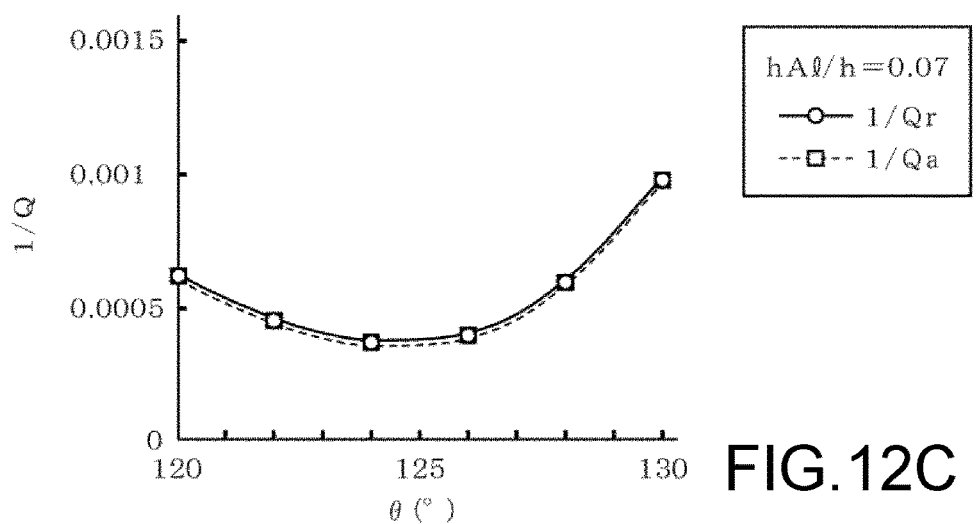

Next, graphs of FIG. 12A to FIG. 12C will be described. The graphs of FIG. 12A to FIG. 12C each have a vertical axis indicating 1/Q and a horizontal axis indicating the angle θ, similarly to the graphs of FIG. 10A to FIG. 10C. The graphs of FIG. 12A, FIG. 12B, and FIG. 12C each indicate a relation between 1/Q and the angle θ when hAl/λ is set to 0.05, 0.06, and 0.07, respectively. Note that, the graphs of FIG. 12A to FIG. 12C are different from the graphs of FIG. 10A to FIG. 10C in indicating the relation between 1/Q and the angle θ when hLT/λ is set such that the values of both Qr and Qa are proper. Specifically, the graphs of FIG. 12A, FIG. 12B, and FIG. 12C each indicate the relation between 1/Q and the angle θ when hLT/λ is determined by hAl/λ and the angle θ of FIG. 11.

Among the graphs of FIG. 12A to FIG. 12C, in the graph of FIG. 12C having hAl/λ=0.07, both 1/Qr and 1/Qa were 0.001 or less in the set range of the angle θ, and it was confirmed that 1/Qr and 1/Qa were especially low at θ=125.25° and its vicinity. That is, it is predicted from this graph of FIG. 12C that thus set angle θ and appropriately set other parameters increase the values of both Qr and Qa. As described as the result of Test 1, it has been confirmed that hLT/λ=0.18 and hAl/λ=0.065 at θ=125.25° provide such high values of both Qr and Qa.

Figure 13:
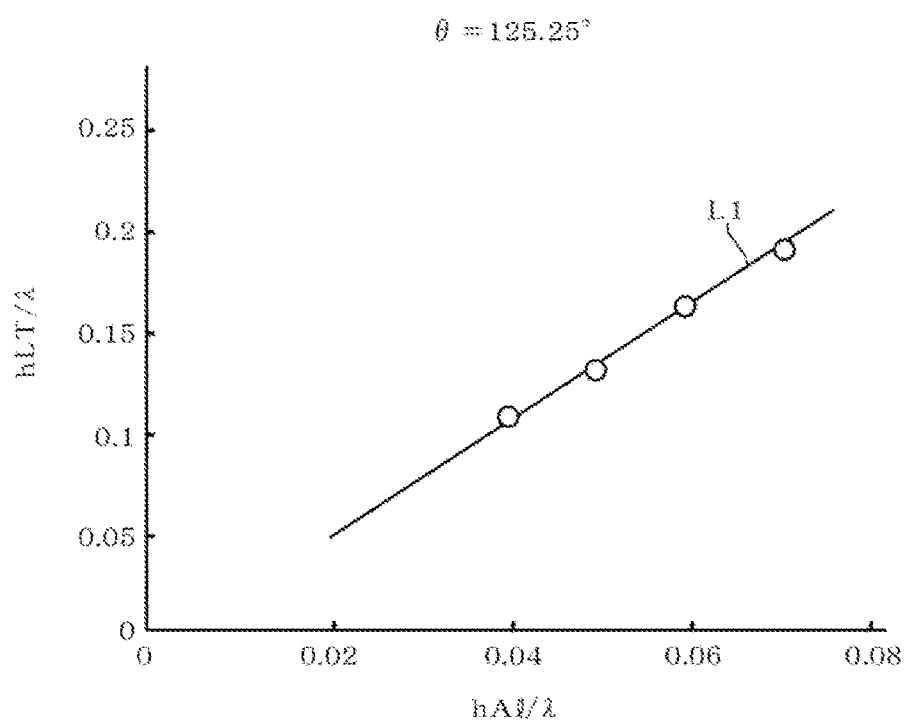
FIG. 13 is a graph indicating the relation between the thickness of the piezoelectric layer and the thickness of the electrode.

FIG. 13 illustrates a graph that has a vertical axis indicating hLT/λ and a horizontal axis indicating hAl/λ. In this graph of FIG. 13, the above-described values of hLT/λ and hAl/λ where both Qr and Qa are proper are plotted in the case of the angle θ=125.25°. Then, an approximate straight line L1 is calculated from the plotted points and illustrated in the graph. For this approximate straight line L1, hLT/λ=2.96×hAl/λ−1.58×10$^{-2}$ and a coefficient of correlation R$^2$=0.998 were satisfied. Therefore, it can be said that a linear correlation exists between hLT/λ and hAl/λ where both Qr and Qa are proper.

Incidentally, this Test 2 examined the relation among hAl/λ, the reflection amount |κ12|, and ρ(hAl/λ)(wAl/λ) at the angle θ=125.25°. A graph of FIG. 14A has a vertical axis indicating κ12 and a horizontal axis indicating hAl/λ, and values of κ12 calculated from hAl/λ set to mutually different values are plotted to be illustrated. Note that, at hAl/λ values of 0.04, 0.05, 0.06, and 0.07, corresponding hLT/λ values are 0.104, 0.13, 0.162, and 0.192, respectively. A graph of FIG. 14B has a vertical axis indicating κ12 and a horizontal axis indicating ρ(hAl/λ)(wAl/λ). In this graph of FIG. 14B, values are plotted so as to be identical to values of the respective points in the graph of FIG. 14A for κ12.

Figure 14A:
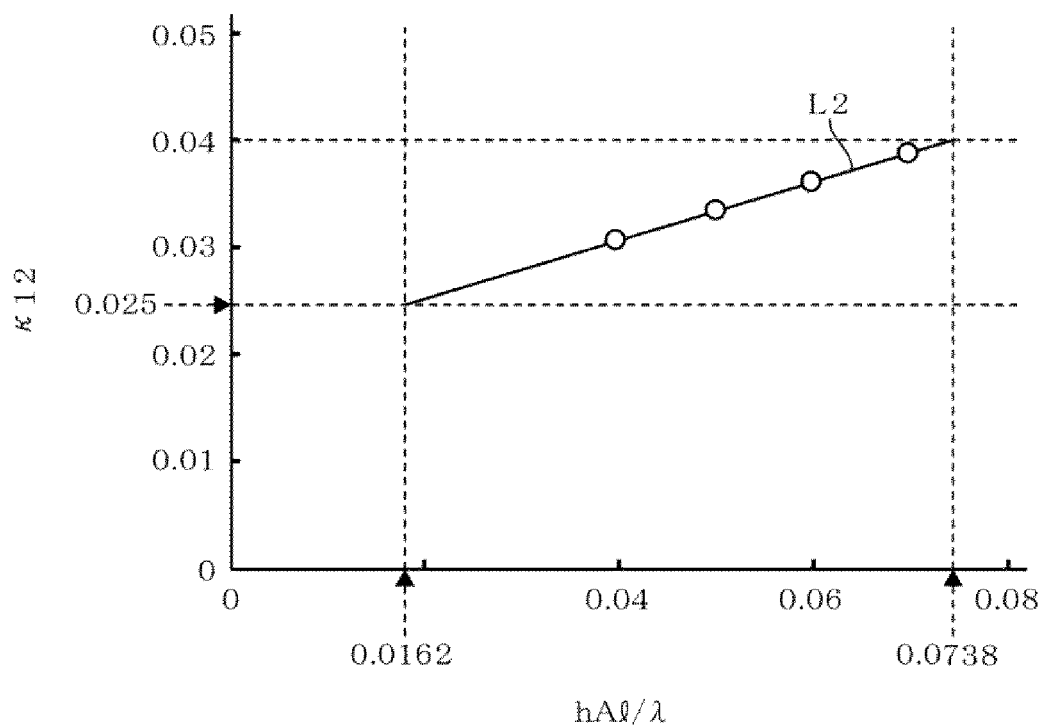
FIG. 14A and FIG. 14B are graphs indicating reflection amounts of the device.
Figure 14B:
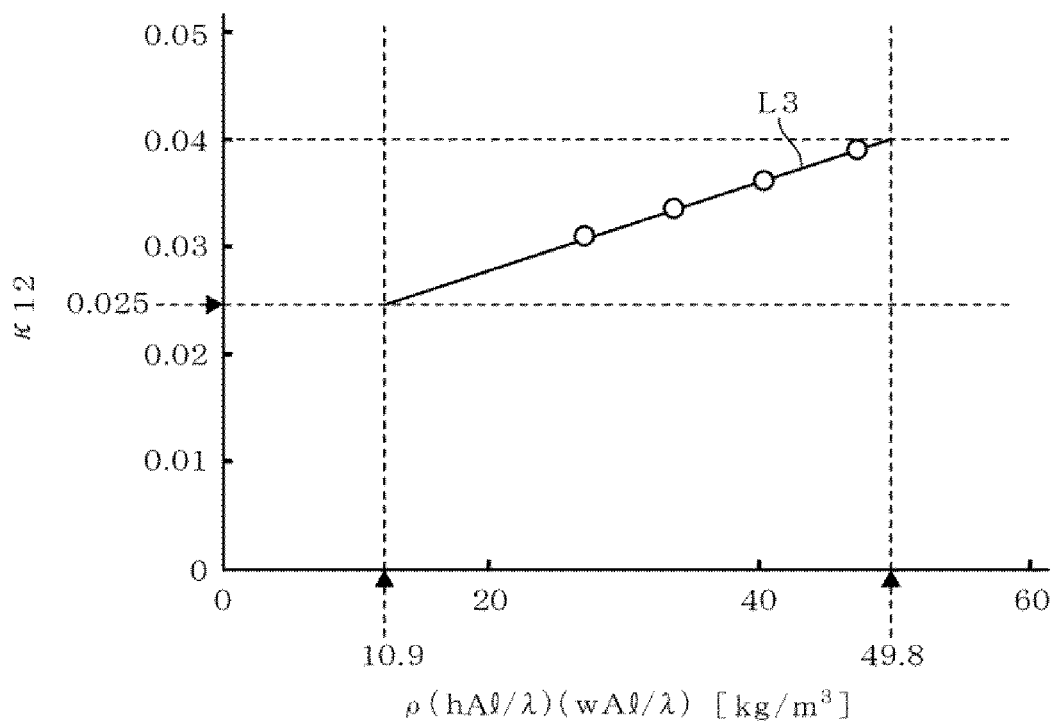

FIG. 14A illustrates an approximate straight line L2 obtained from the plotted points. For this approximate straight line L2, κ12=2.60×10$^{-1}$×hAl/λ+2.08×10$^2$ and the coefficient of correlation R$^2$=0.996 are satisfied. FIG. 14B illustrates an approximate straight line L3 obtained from the plotted points. For this approximate straight line L3, κ12=3.85×10$^{-4}$×ρ(hAl/λ)(wAl/λ)+2.08×10$^{-2}$ and the coefficient of correlation R$^2$=0.996 are satisfied. Thus, from the respective coefficients of correlation of the approximate straight lines L2 and L3, it can be said that the linear correlation exists among hAl/λ, κ12, and ρ(hAl/λ)(wAl/λ).

As described above, the practically effective κ12 is 0.025 to 0.04. From the graph of FIG. 14B, ρ(hAl/λ)(wAl/λ) corresponding to this range of κ12 is 10.9 kg/m$^3$ to 49.8 kg/m$^3$. From the graph of FIG. 14A, a range of hAl/λ corresponding to the range of the above-described κ12 is 0.0162 to 0.0738, and a range of hLT/λ corresponding to this range of hAl/λ is 0.032 to 0.203 from the graph of FIG. 13. Accordingly, hAl/λ and hLT/λ are preferred to be set in these ranges. Note that, from an aspect of ensuring the ease in the mass production of the device with the relatively large value of hAl/λ, more preferably, this hAl/λ is set to 0.030 to 0.074, for example. The value of hLT/λ in a range corresponding to this hAl/λ is 0.073 to 0.203 from the graph of FIG. 13, and more preferably, hLT/λ is set to the value in this range.

The following summarizes the results of Test 2. While hAl/λ is preferred to be set to a relatively large value as described above, it was confirmed from FIG. 12C that when setting hAl/λ to a relatively large value such as hAl/λ=0.07 (7%), setting the angle θ to 125.25° or its vicinity could decrease both 1/Qr and 1/Qa. Specifically, the angle θ is set to a range of ±3° with respect to θ=125.25°, that is, θ=122.25° to 128.25°. More preferably, the angle θ is set to range of θ=125.25±1°. From FIG. 12A and FIG. 12B, in the cases of hAl/λ=0.05 and 0.06, both 1/Qr and 1/Qa are reduced to relatively low values at the value of the angle θ higher than 125.25°. Accordingly, it is considered that when hAl/λ is less than 0.07, the angle θ is preferred to be set to the value more than 125.25°. Now, it is considered that the characteristics of the device do not significantly change without significantly changing the angles ψ and μ from the value set in this Test 2. Specifically, it is considered to be only necessary that the angles ψ and μ are in a range of ±2° with respect to the value set in this test. That is, it is only necessary that ψ=43° to 47° and μ=−47° to −43° are satisfied. Then, preferably, the angles ψ and μ are obtained in a range of ±10 with respect to the value set in this test, that is, ψ=44° to 46° and μ=−46° to −44°.

Then, it was confirmed in this Test 2 that the above-described respective settings of θ=125.25°, ψ=45°, and μ=−45° provided the preferable κ12 in the relatively wide range of 10.9 kg/m$^3$ to 49.8 kg/m$^3$ for ρ(hAl/λ)(wAl/λ). Then, since ρ(hAl/λ)(wAl/λ) corresponds to hAl/λ and hLT/λ, ρ(hAl/λ)(wAl/λ) settable to the relatively wide range means that hAl/λ and hLT/λ are also settable to relatively wide ranges, thus ensuring these hAl/λ and hLT/λ to be settable to relatively large values advantageous on the mass production of the device. While the description has been given such that the Q factor among the TCF, the k$^2$, and the Q factor was examined in Test 2, it was confirmed in practice that the respective values of the TCF and the k$^2$ did not significantly vary in the ranges of parameters (θ, hAl/λ, and hLT/λ) set in this Test 2. That is, the respective values of the TCF and the k$^2$ do not significantly vary from those described as the result of Test 1.

Now, it is considered that the characteristics of the SAW device to be manufactured do not significantly change insofar as the angle of cutting the piezoelectric layer 32 does not significantly deviate from the above-described value. Then, it is considered to be only necessary that, for example, a described with reference to FIG. 5 is obtained in a range of ±2° with respect to 31°. Accordingly, for example, X−29° to 33° Y is considered to be preferable. This piezoelectric layer 32 is not necessarily configured with LT, and for example, a configuration with LiNbO$_3$ (lithium niobate), which has a crystalline structure similar to that of LT, is considered to provide characteristics of the SAW device mostly similar to the case using LT. The laminated body of the electrode film 23 and the substrate 3 described with reference to FIG. 2 is applicable to a duplexer where the ladder-type filters are applied to respective receiving side filter and transmitting side filter, or an oscillator using the SAW resonator 1 in addition to the ladder-type filter 10 illustrated in FIG. 1. That is, the SAW device of the disclosure is not limited to the ladder-type filter 10.

With the surface acoustic wave device according to the embodiment, the respective characteristics of the device including the Q factor can be improved even if the thickness of the Inter Digital Transducer is configured to have the relatively large value for the sufficient reflection characteristic of the device.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A surface acoustic wave device, comprising:
   a quartz layer;
   a piezoelectric layer, being laminated on the quartz layer; and
   an Inter Digital Transducer, being formed on the piezoelectric layer, and the Inter Digital Transducer exciting a surface acoustic wave on the piezoelectric layer,
   wherein
   a rotation in a right-screw direction of the quartz layer is assumed as a +-rotation,
   a three-dimensional coordinate system formed by an x1-axis, a y1-axis, and a z1-axis respectively matching an X-axis, a Y-axis, and a Z-axis as crystallographic axes of a quartz-crystal of the quartz layer is rotated from +125.25° in a range of ±3° with the x1-axis as a rotation axis,
   subsequently, the three-dimensional coordinate system is rotated from +45° in a range of ±2° with the z1-axis as the rotation axis,
   subsequently, the three-dimensional coordinate system is rotated from −45° in a range of ±2° with the x1-axis as the rotation axis,
   the quartz layer is cut along a surface as a sectional plane perpendicular to the z1-axis, and
   the quartz layer has a propagation direction of the surface acoustic wave in a direction parallel to the x1-axis.

2. The surface acoustic wave device according to claim 1, wherein
   $\rho(h1/\lambda)(w1/\lambda)$ is equal to 10.9 kg/m$^3$ to 49.8 kg/m$^3$, where
   a density of a material constituting the Inter Digital Transducer is $\rho$ (kg/m$^3$),
   a wavelength of the surface acoustic wave is $\lambda$ (μm),
   a thickness of the Inter Digital Transducer is h1 (μm), and
   a width of an electrode finger constituting the Inter Digital Transducer is w1 (μm).

3. The surface acoustic wave device according to claim 2, wherein
   $h1/\lambda$ is equal to 0.0162 to 0.0738.

4. The surface acoustic wave device according to claim 1, wherein
   the piezoelectric layer is X-29° to 33° Y LiTaO$_3$.

5. The surface acoustic wave device according to claim 2, wherein
   $h2/\lambda$ is equal to 0.032 to 0.203, where a thickness of the piezoelectric layer is h2.

6. The surface acoustic wave device according to claim 1, wherein
   the surface acoustic wave device is used in a bandwidth of 2 GHz or more.

\* \* \* \* \*